United States Patent [19]

Masuda et al.

[11] 3,772,100

[45] Nov. 13, 1973

[54] METHOD FOR FORMING STRIPS ON SEMICONDUCTOR DEVICE

[75] Inventors: Noboru Masuda, Kawaguchi; Yu Nishino; Hiroaki Kase, both of Tokyo, all of Japan

[73] Assignee: Denki Onkyo Co., Ltd., Tokyo, Japan

[22] Filed: June 30, 1971

[21] Appl. No.: 158,492

[52] U.S. Cl. .......................... 156/3, 156/11, 156/13, 156/17

[58] Field of Search .......................... H011/7/50, 156/17, 11, 13, DIG. 2, 17

[56] References Cited

UNITED STATES PATENTS

| | | | |
|---|---|---|---|
| 3,518,135 | 6/1970 | Cerniglia | 156/17 |
| 3,262,825 | 7/1966 | Fuller | 156/17 |
| 3,445,925 | 5/1969 | Lesk | 29/577 |
| 3,046,176 | 7/1962 | Bosenberg | 156/11 |
| 3,679,501 | 7/1972 | Chicotka | 156/17 |

*Primary Examiner*—William A. Powell
*Attorney*—James E. Armstrong et al.

[57] ABSTRACT

A method for forming a plurality of metal strips on a semiconductor device comprising forming a metallic layer on a surface of semiconductor base, coating a photo sensitive resin layer on the said surface of the metallic layer, forming at least one pattern corresponding to at least one metal strip on the sensitized resin layer and etching the metallic layer with an etching solution which oxidizes the semiconductor base.

13 Claims, 20 Drawing Figures

METHOD FOR FORMING STRIPS ON SEMICONDUCTOR DEVICE

BACKGROUND OF THE INVENTION

The present invention relates to a method for forming metal strips or bars on a semiconductor device which is made of an intermetallic compound, such as indium-antimony and serves as a magnetro-resistance effect device, Gunn diode, etc.

As is known, this type of semiconductor device includes shorting bars or strips which serve to short both sides of the device so that the Hall potential is uniform Conventionally, such bars or strip are formed on the surface of the device by vacuum-evaporating a metallic layer at a right angles to the direction of current flow with terminal electrodes being formed by vacuum-evaporating a metal to connect the lead wires. The resulting shorting bars serve to improve the magnetic sensitivity characteristics of the semiconductor device.

However, the conventional metal strip forming process depends on evaporation of a metal on a small semiconductor device which is formed in a predetermined shape. Accordingly, it is difficult to form the metal strips at specified positions. For example metal strips are often misaligned or the strips project out of the semiconductor device.

Production of uniform products by means of the foregoing process is difficult with many rejects are formed during production. Furthermore, the process of forming the strips extremely troublesome and accordingly is high in production cost.

The present invention provides a metal strip forming method which eliminates the disadvantages described above.

SUMMARY

The present invention provides a method for forming metal strips on a semiconductor device which comprises forming a thin metallic layer by coating a metal on one complete surface of the base, the base being made of intermetallic compound and formed into a desired shape and thickness, forming a multi-layer material by providing a sensitive resin layer on a top of the thin metallic layer, forming at least one pattern or photo-resist corresponding to the metal strip by sensitizing the resin layer and etching thin metallic layer of the multi-material with an etching solution capable of oxidizing the base to form at least one metal strip etching being stopped by formation of the oxidized layer on the surface of the base with the etching solution.

BRIEF DESCRIPTION OF THE DRAWINGS

The present invention is illustrated in detail in the accompanying drawings wherein.

DETAILED DESCRIPTION

The base to be used in a method according to the present invention is finished to specified thickness as follows.

A semiconductor ingot is cut into wafers each of thickness of approximately 300$\mu$. One surface of a wafer is bonded on to a working plate such as, for example, a ceramic plate or brass plate, which satisfies the desired mechanical accuracy, with a thermal soluble bonding agent, for example, wax. The other surface of the wafer is lapped by a conventional mechanical lapping means so that the thickness of the wafer becomes 180 – 280$\mu$ and is mirror-finished thereby or with other suitable mechanical polishing means. The wafer is then removed by melting the wax with heat and the coarse, unpolished surface of the wafer is bonded to a temporarily used substrate such as, for example, glass or ceramic, with said bonding agent.

Under this condition, the wafer is lapped in thickness of 160 – 180$\mu$ by a conventional chemical treatment, after which, the wafer is detached from the temporary substrate by melting the wax and the polished surface of the wafer (referring to FIG. 1*a*) is fixed to substrate S such as, ferrite or glass, with thermo-setting bonding agent 101, for example, epoxy resin. The exposed coarse surface of the wafer is then lapped by a mechanical lapping means until the thickness of the wafer becomes approximately 30$\mu$ and is mirror-finished by the same mechanical polishing means described above.

At this point, the treated surface of the wafer according to conventional processes would be lapped so as to obtain a predetermined thickness, for example, 10$\mu$ by the chemical treatment. However, the conventional chemical treating method is accompanied by several problems. Because the amount of material removed from the wafer by chemical treating is a function of time, it is necessary to carefully select the conditions and therefore processing is extremely tedious. Further, a difference in the amount of removal is inevitable because the metallic ion content in the solvent changes even though the treating conditions are strictly controlled. Accordingly, the thickness of the wafers which are treated for the same length of time at the same temperature vary with direct detection of unevenness in the thickness of individual wafers being very difficult.

For the above reasons, rather than the conventional chemical treatment, it is desirable to adopt the following treating technique as the final treating method for a semiconductor wafer.

Figure 1A:
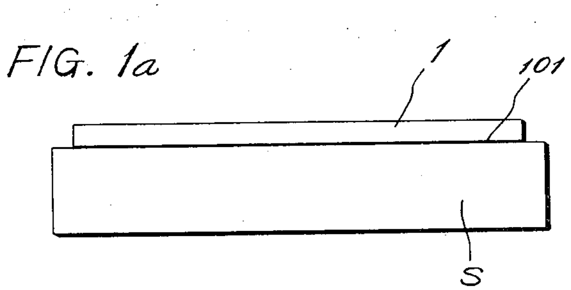
FIGS. 1*a* to 1*c* are the side views of an semidoncutor wafer illustrating the lapping of a wafer as a pretreatment step according to one embodiment the present invention.
Figure 1B:
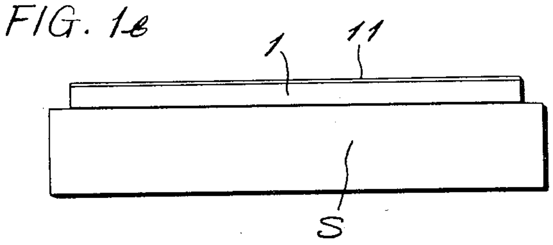
Figure 1C:
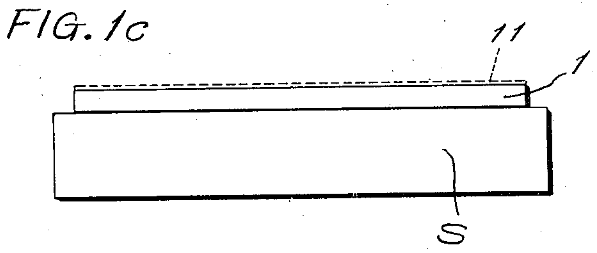

Semiconductor wafer 1 shown in FIGS. 1*a* to 1*c* is made of an intermetallic compound such as GaAs, GaP, InSb or InAs, and its has a thickness of approximately 30$\mu$. Both surfaces of the wafer have been mirror-finished for example as indicated above, one being bonded to substrate S.

Wafer 1, which having been cut by a the aforesaid mechanical lapping process is then immersed in an oxidizing agent solution shown in Table 1, to oxidize one surface thereby forming oxidized layer 11 as shown in FIG. 1*b*.

TABLE 1

| Semiconductor | Oxidizing agent solution | Reducing agent |
|---|---|---|
| InSb | $HNO_3 \cdot H_2O$ | $HF \cdot H_2O$ |
| | $H_2O_2 \cdot H_2O$ | $HF \cdot H_2O$ |
| | $HNO_3 \cdot CH_3COOH$ | $HF \cdot CH_3COOH$ |
| | $HNO_3$ | HCl |
| InAs | $HNO_3$ | HF |
| | $H_2O_2$ | HF |
| GaAs | $HNO_3 \cdot H_2O$ | $HCl \cdot H_2O$ |
| | $H_2O_2 \cdot H_2O$ | $NaOH \cdot H_2O$ |
| | $HNO_3 \cdot H_2O$ | $AgNO_3 \cdot H_2O$ |
| GaP | $HNO_3 \cdot H_2O$ | $HCl \cdot H_2O$ |
| | $HNO_3 \cdot CH_3COOH$ | $HF \cdot Br_2 \cdot CH_3COOH$ |

This oxidization, for example, may be accomplished simply by immersing a wafer made of InSb in a solution of $HNO_3$ of about 60 percent concentration for several seconds and oxidized layer 11 approaching the saturation point of the oxidation is formed on wafer 1. However, the most desirable immersion time is approximately 5 to 10 seconds to render uniform the thickness of oxidized layer 11.

Because this treatment can be carried out at room temperature, that is, at a temperature of 0°C–32°C, there is no problem with respect to the temperature control. If oxidized layer 11 is formed by the oxidization technique described above, the surface hue of wafer 1 changes. Accordingly, the formation of the oxidized layer can be determined by the variation of the hue on the surface. The resulting thickness of oxidized layer 11 is uniform because oxidized layer 11 is formed without being affected by change of metallic ion concentration in the solution.

The oxidized wafer is immersed in a reducing agent, which removes oxdized layer 11, such as shown in Table 1, and thus the wafer is reduced by dissolving the oxidized layer shown in FIG. 1*c*.

In this case, when wafer 1 regains the original gloss of an intermetallic compound, the wafer should be removed from the reducing agent.

At this stage, oxidized layer 11 of the wafer having been 1 – 2$\mu$ thick, an amount of the wafer corresponding to the thickness of the oxidized layer has been chemically removed.

If the oxidization and reduction treatment are regarded as a unit process for chemical treatment, one unit process results in a size reduction of the oxidized layer to the extent of 1 – 2$\mu$. By repeating this process, wafer 1 may be reduced to any desired thickness.

Oxidized layer 11 is generally developed to the saturation point of the oxidation. However, because formation of the oxidized layer may be detected by checking variation in the color of the layer, the difference in the amount of reflected light serves as a measurement of thickness using an appropriate device for measuring the amount of reflected light and the time for oxidation of the wafer may be controlled according to the corresponding thickness measurement.

In this case, because the thickness of oxidized layer 11 can be measured even though its formation is not developed up to the saturation point, the oxidized layer can be formed in a thickness of 1$\mu$ or less and then layer 11 can be removed by the reduction treatment.

Accordingly, the method based on the present invention is advantageous in that wafer 1 can be reduced in size in an extremely fine range with the amount of size reduction can be accurately controlled.

Wafer 1 is formed in a desired thickness by chemical treatment according to the processes described above.

Figure 2:
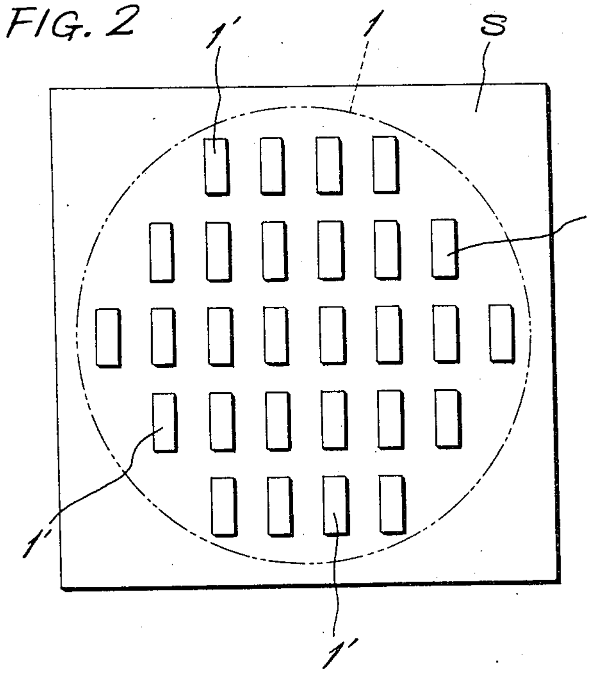
FIG. 2 is a plan view of a substrate with a plularity of bases formed thereon.
Figures 3, 4, 5, 6:
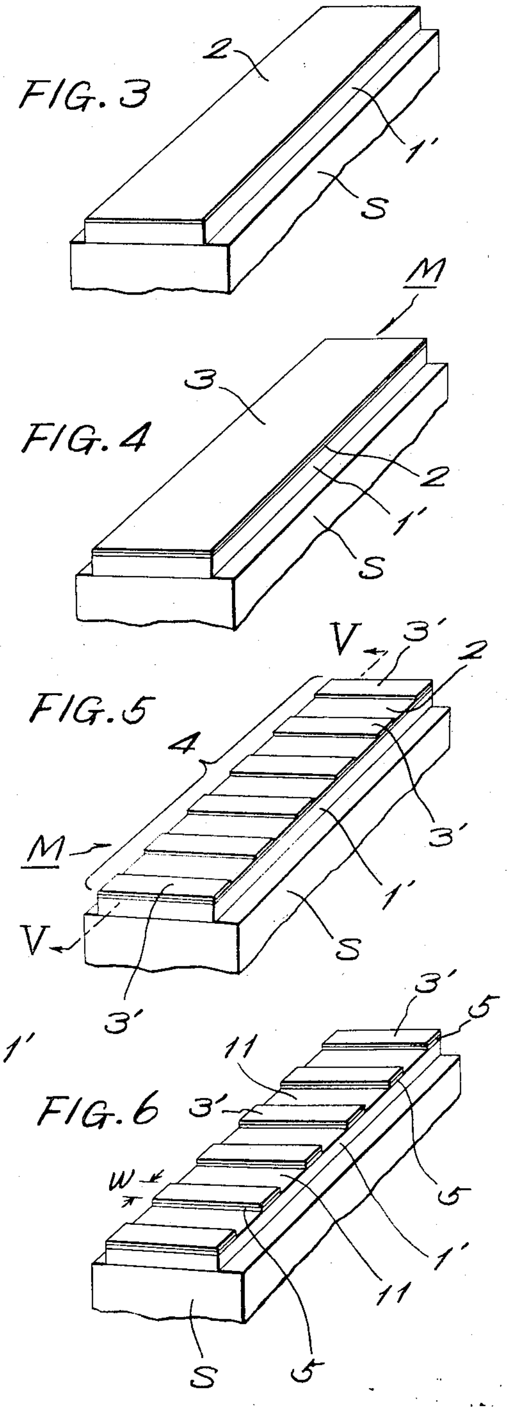
FIGS. 3 to 6 are isometric views of a base formed from said wafer steps of a method according to another embodiment the present invention.

A number of bases can be obtained from wafer 1 by conventional chemical etching means as shown in FIG. 2. The wafer can be divided into bases so that a shape and size of each base coincide with a desired one semiconductor device as shown in FIG. 2 or so that a shape and size of each base is large enough to obtain a plurality of semiconductor devices or the wafer itself can be used as the base so that a plurality of semiconductor devices are finally obtained by dividing it. Regarding FIGS. 3 to 7, the description is limited to one semiconductor device alone to simplify the description. FIG. 3 shows a first step of the method according to the present invention. With this step thin metallic layer 2 is formed by metallizing or plating a metal such as for example, Cu, Zn, Cd, Pb, Se, Te, In, Pt, Au, Ag or Ni on the surface of base 1'.

The metal to be used for this process should be selected in accordance with compatibility with the metal of base 1' and also the purpose of use; for example, indium can be used to form metal strips on base 1' made of indium-antimony.

After thin metallic layer 2 has been coated on base 1', sensitive resin layer 3, for example, K.T.F.R., K.M.E.R. and K.P.R. of KODAK, is formed on the thin metallic layer and multi-layer piece M is formed.

Figures 12, 13, 14, 15, 16, 17, 18:
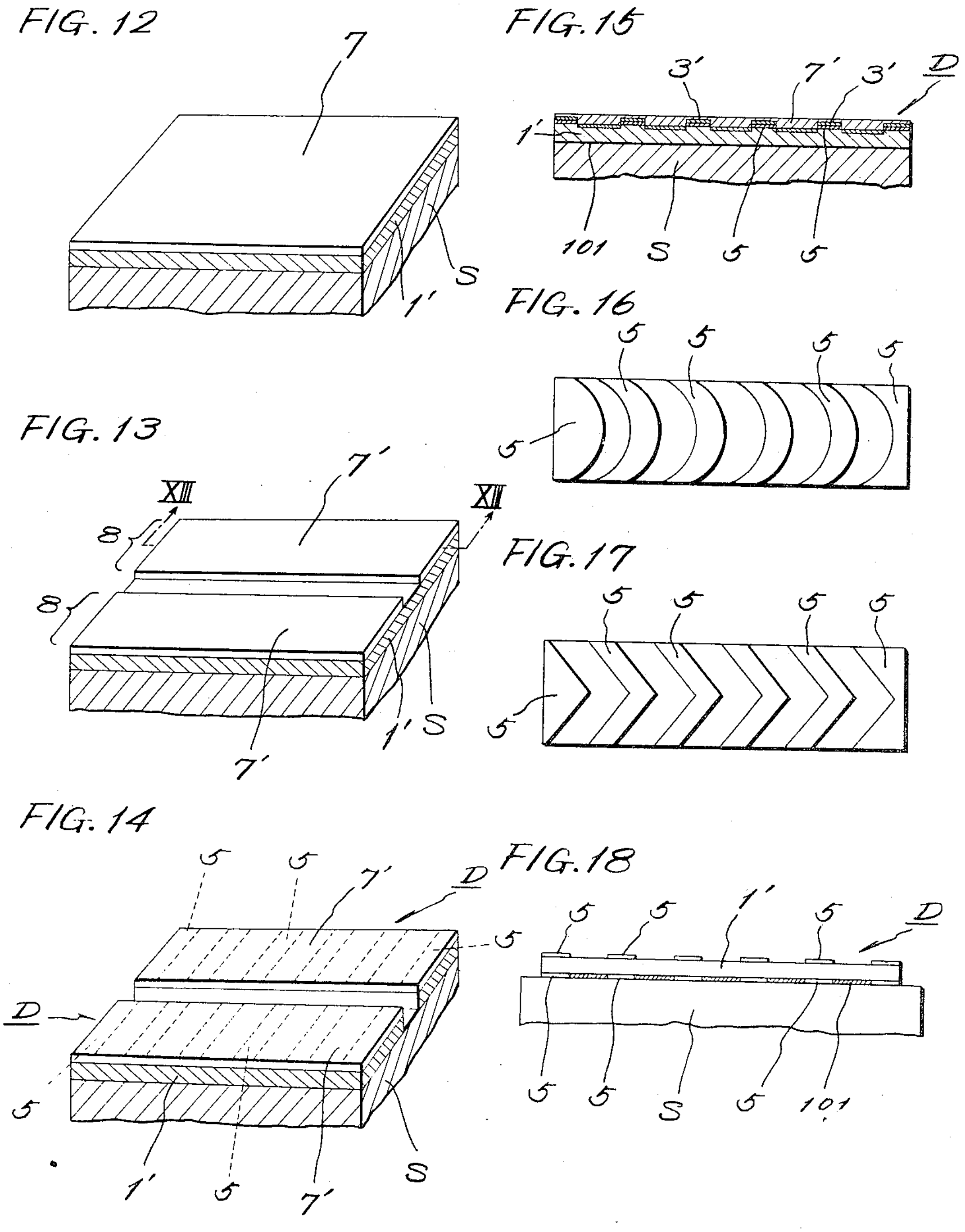
FIG. 15 is a cross sectional side view along line XIII—XIII of FIG. 13.
FIGS. 16 and 17 show other embodiments of strips formed according to the invention.
FIG. 18 shows a close sectional view of a device of the method of another embodiment.

After this step, pattern 4 corresponding to the desired metal strips is formed by sensitizing the resin layer and by etching the sensitized resin layer. Pattern 4 preferably consists of parallel strips traversing the entire length of multi-layer piece M in a crosswise direction as shown in FIGS. 5, 16 and 17. As shown, the pattern may be formed in straight lines, curved lines, anuglar lines or other desired forms.

The metal strips ultimately obtained from pattern 4 serve to short both sides of the resulting device (5) so that the Hall thereof becomes uniform. If the pattern is formed only at both ends of multi-layer piece M, the metal strips become terminal electrodes. After pattern 4 has been formed on multi-layer piece M, the latter is etched to remove the exposed portions of thin metallic layer 2 according to the pattern leaving plurality of metal strips 5 on which sensitized resin 3' remains as shown in FIG. 6, that is, shorting bars and/or terminal electrodes are formed.

Figures 7, 8, 9, 10, 11:
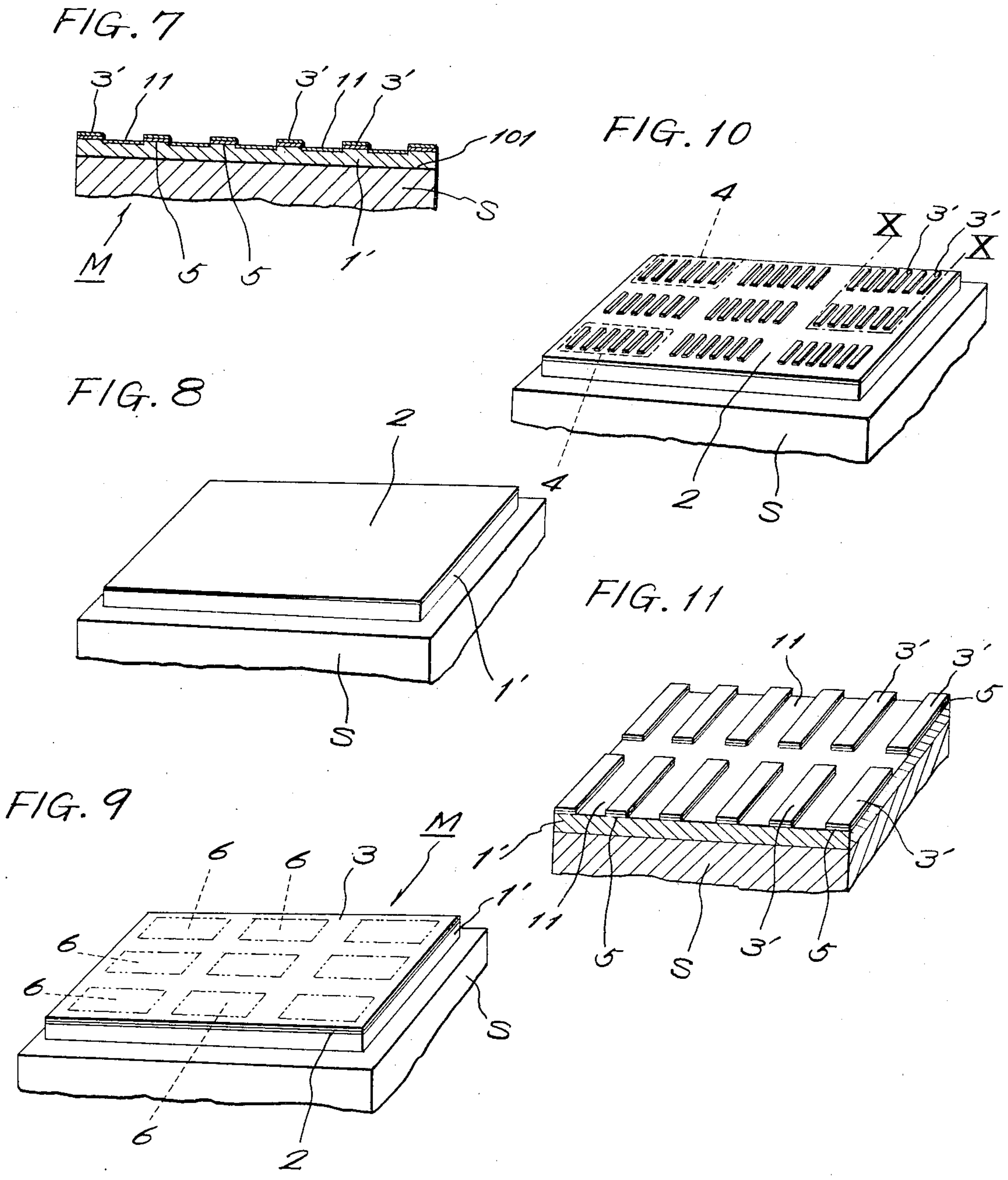
FIG. 7 is a cross-sectional side view along line V—V of FIG. 5.
FIG. 8 to 14 are isometric views of the base which show other embodiments of the method according to the present invention.

For this step, an oxidizing agent such as, for example, shown in Table 2 is used as the etching solution and oxidized layer 11 as shown in FIG. 7 is formed on the surface of base 1'.

Table 2

| Metal | Etching solution | Metal | Etching solution |
|---|---|---|---|
| Cu | or $HNO_3$ | In | $HNO_3$ or HCl |
| Zn | $HNO_3$ | Pt | $Br_2 \cdot H_2O$ |
| Cd | $HNO_3 \cdot NH_3$ | Au | $H_2SO_4$ |
| Pb | $HNO_3$ | Ag | $HNO_3$ |
| Se | Conc $H_2SO_3$ | Ni | $H_2SO_4$ |
| Te | $HNO_3$ | | |

In this case, it is necessary to use an etching solution which serves both to oxidize base 1' and to dissolve thin metallic layer 2. And etching time is usually 2 – 60 seconds.

In this step, oxidized layer 11 is formed on the base and etching of the base therefore is stopped by the oxidized layer which proceeds only to the saturation point of the oxidation.

Finally, the semiconductor device is completed by removing sensitized resin 3' remaining on the metal strips with appropriate photo-resist removing means (such as described later).

The present invention is as described above. It has following advantages.

In the step shown in FIG. 6, oxidized layer 11 is formed on the surface of base 1' and etching of the semiconductor material is stopped.

Accordingly, the base is prevented from being further etched by the etching solution because of the formation of the oxidized layer to the extent of the saturation point, and etching of the thin metallic layer can be facilitated and the thickness of the device can be made uniform. Because the metal strips are formed on base 1' by means of a photo-etching process, after the base has been entirely covered with thin metallic layer 2, the metal strips are not misaligned or projected.

Therefore, the rejection of off-grade can be effectively prevented and width W of the metal strips can be accurately controlled because the shape of metal strips is determined by sensitized pattern 4. Because the method of the embodiment of FIGS. 3 to 7 is as described above, it provides a very effective way for the formation of the desired type of metal strips.

Referring to FIGS. 8 to 15, there is shown another method of the present invention. According to this method, a number of semiconductor devices are obtained from one base.

FIGS. 11 to 14 are the magnified views of the portion indicated with X-X line in FIG. 10 for ease of understanding.

This method comprises (1) a first step wherein a metal is coated, as shown in FIG. 8, on one surface of base 1' which is an intermetallic compound such as InSb, InAs, GaAs and GaP, etc., having a surface area larger than twice that of the desired device, (2) a second step wherein sensitive resin layer 3 is formed by coating the sensitive resin over the entire surface of thin metallic layer 2 to produce multi-layer piece M as shown in FIG. 9; (3) a third step wherein the surface of the sensitive resin layer is tentatively divided into a plurality of surfaces 6 which respectively correspond to the shape of one device, by sensitizing and etching to obtain a plurality of patterns 4, each corresponding to a group of metal strips formed on each corresponding surface 6 as shown in FIG. 10; (4) a fourth step wherein metallic layer 2 of multi-layer piece M is etched with the etching solution shown in Table 2, which is capable of oxidizing the material of base 1' to form, metal strips 5 that is, the shorting bars and terminal electrodes, and oxidized layer 11 similar to the previously discussed oxidized layer shown in FIG. 7 on the surface of base 1' (5) a fifth step wherein the sensitive resin is once again coated over the entire surface of multi-layer piece M as layer 7 as shown generally in FIG. 12 or more specifically in the cross section of FIG. 15; (6) a sixth step wherein patterns 8 containing the sensitized resin layer 7' in the same shape as the semiconductor devices are formed by photo-etching as shown generally in FIG. 13; (7) a seventh step wherein the multi-layer piece having the sensitized patterns of the sixth step is etched with the etching solution shown in Table 3 which serves to reduce base 1' until the latter is divided into the patterns as shown in FIG. 14 to form a plurality of multi-layer semiconductor devices D each having internal metal strips; (8) a eight step wherein sensitized resin layer 7' on semiconductor devices D including the sensitized resin 3' remaining on the metal strips is removed by a mechanical or chemical means Table 3

| Semiconductor | Etching solution |
|---|---|
| InSb | $HF \cdot HNO_3 \cdot H_2O$; $HF \cdot H_2O_2 \cdot H_2O$; $HNO_3 \cdot HF \cdot CH_3COOH$ or $HNO_3 \cdot HCl$ |
| InAs | $HF \cdot HNO_3$ or $H_2O_2 \cdot HF$ |
| GaAs | $HCl \cdot HNO_3 \cdot H_2O$; $H_2O_2 \cdot NaOH$ or $HNO_3 \cdot H_2O \cdot AgNO_3$ |
| GaP | $HCl \cdot HNO_3 \cdot H_2O$ or $HNO_3 \cdot HF \cdot Br_2 \cdot CH_3COOH$ |

(the mechanical means preferably includes a resist stripper employing high-frequency burning, and the chemical means preferably includes the resist thinner, a mixture of sulfuric acid and surface active agent, wherein the surface active agent used is of a styrene sulfonate base, cation base, anion base or amphoteric base); and (9) a ninth step wherein the substrate on which a number of semiconductor devices are formed is cut and separated into individual semiconductor devices by a mechanical means such as the microscriber.

In the above process, the treatments can be optionally performed as follows (with reference to the above numbered steps):

The base is divided into a number of semiconductor devices through the fifth, sixth, and seventh steps after the first step; after sensitive resin layer 7' on each device has been removed by the means described in the eighth step, metal strips are made in the second, third and fourth steps; the sensitized resin 3' on each strip is removed by the means described in the eighth step, and the substrate can be thus divided into semiconductor devices in the ninth step.

According to the present invention, other metal strips can be provided on the other surface of the semiconductor device as shown in FIG. 18 by means such as described above.

In this case, the metal strips are formed on the chemically-treated surface of a wafer in the procedures described in steps (1) to (4) before removing the wafer from the temporary substrate. The wafer is turned up side down after the sensitized resin is removed and is fixed to the substrate.

The above described method according to the present invention is advantageous in the following points. A number of semiconductor devices D on which the metal strips are formed can be obtained at the same time permitting mass production at low cost.

Because base 1' with a large surface area is used, handling is easy during every step of the process. A number of devices D are obtained by dividing one multi-layer piece M and therefore the characteristics of the divided devices D are uniform.

The method according to the present invention has the advantages described above. As such, the method of the invention is highly effective for production of this type of semiconductor device, the demand for which is ever increasing.

What is claimed is:

1. A method for forming metal strips on a semiconductor base material comprising a. forming said semiconductor base to a predetermined thickness by repeatedly forming an oxidized layer on at least one surface of a semiconductor wafer by etching and removing said oxidized layer by etching with a reducing acid;

b. coating at least one complete surface of said semiconductor base with a thin layer of metal, said base comprising an intermetallic compound;

c. superimposing a patterned photo-sensitive resin on the thin metallic layer to form a multi-layer piece;

d. forming said pattern corresponding to at least one metal strip on the metallic layer by sensitizing the sensitive resin layer and by developing the sensitized resin layer;

e. treating the multi-layered material with an oxidizing etching solution so as to remove the portions of the thin metallic layer corresponding to said pattern and to oxidize the surface of the base thereby forming at least one metal strip on the semiconductor base.

2. A method according to claim 1, wherein the base is performed in the specified shape and thickness of a semiconductor device.

3. A method according to claim 1, wherein a plurality of metal strips are formed by means of pattern of parallel straight lines.

4. A method according to claim 1, wherein a plurality of metal strips are formed by means of pattern of angular lines.

5. A method according to claim 1, wherein a plurality of metal strips are formed by means of pattern of curved lines.

6. A method according to claim 1, wherein two parallel metal strips corresponding to terminal electrodes are formed at opposite ends of a semiconductor device.

7. A method according to claim 1, wherein the remaining sensitized resin on the metal strips is removed after etching has been terminated thus exposing the metal strips.

8. A method according to claim 1, wherein a multilayer piece having an area larger than twice that of a completed semiconductor device is divided into a plurality of surfaces corresponding to a plurality of devices, patterns are formed on the respective surfaces of the piece, the piece, subsequent to etching, is cut into corresponding to the plurality of devices, and the substrate is divided into semiconductor devices.

9. A method according to claim 8, wherein a sensitive resin layer is formed by covering with a sensitive resin the base on which metal strips corresponding to the first patterns have been formed by etching, a plurality of patterns which correspond to the plurality of devices are formed on the sensitive resin layer and the base is again etched according to the patterns with an etching solution which serve to reduce the oxidized surface of the base, and the base is subsequently divided into parts corresponding to the plurality of devices, and the sensitized resin layer on each device is removed.

10. The method of claim 1 wherein said semiconductor base is secured on a substrate.

11. The method of claim 10 wherein said metal strips are formed prior to securing said semiconductor base to said substrate.

12. The method of claim 1 wherein said semiconductor is secured to a substrate prior to forming said semiconductor base to a predetermined thickness.

13. The method of claim 12 wherein said predetermined thickness is less than $30\mu$.

* * * * *